United States Patent
Zhang et al.

(10) Patent No.: US 12,072,356 B2
(45) Date of Patent: Aug. 27, 2024

(54) VOLTAGE DETECTION CIRCUIT AND METHOD FOR INTEGRATED CIRCUIT, AND INTEGRATED CIRCUIT

(71) Applicant: Lemon Inc., Grand Cayman (KY)

(72) Inventors: Junmou Zhang, Los Angeles, CA (US); Shan Lu, Los Angeles, CA (US); Chuang Zhang, Los Angeles, CA (US); Yimin Chen, Los Angeles, CA (US); Jian Wang, Beijing (CN); Yuanlin Cheng, Beijing (CN)

(73) Assignee: Lemon Inc., Grand Cayman (KY)

( * ) Notice: Subject to any disclaimer, the term of this patent is extended or adjusted under 35 U.S.C. 154(b) by 295 days.

(21) Appl. No.: 17/737,373

(22) Filed: May 5, 2022

(65) Prior Publication Data
US 2022/0357370 A1 Nov. 10, 2022

(30) Foreign Application Priority Data
May 7, 2021 (CN) .......................... 202110497286.9

(51) Int. Cl.
*G01R 19/10* (2006.01)
*H03K 17/687* (2006.01)

(52) U.S. Cl.
CPC ......... *G01R 19/10* (2013.01); *H03K 17/6871* (2013.01)

(58) Field of Classification Search
CPC .. G01R 19/10; G01R 19/16552; G01R 19/00; G01R 31/2851; H03K 17/6871; H03K 2217/0027

See application file for complete search history.

(56) References Cited

U.S. PATENT DOCUMENTS

| 5,929,679 A * | 7/1999 | Ohwada ................ H03K 5/082 327/206 |
| 2020/0264232 A1 | 8/2020 | Nierop et al. |

FOREIGN PATENT DOCUMENTS

| CN | 101403772 A | 4/2009 |
| CN | 105388349 A | 3/2016 |
| JP | H09-243674 A | 9/1997 |
| JP | 2012-088230 A | 5/2012 |
| TW | 202102859 A | 1/2021 |

* cited by examiner

*Primary Examiner* — Metasebia T Retebo
(74) *Attorney, Agent, or Firm* — Faegre Drinker Biddle & Reath LLP

(57) ABSTRACT

A voltage detection circuit and method for an integrated circuit, and an integrated circuit are provided. The voltage detection circuit includes: a first current source, a first branch and a second branch. A current outputted by the first current source is allocated to the first branch and the second branch. The first branch includes a first voltage control current component and a first load connected in series. The second branch includes a current signal detection component and a second load connected in series. A voltage signal to be detected is inputted to a control signal input terminal of the first voltage control current component. The current signal detection component is configured to output, in real time, a preset signal characterizing a second current flowing through the second branch, to determine change of the voltage signal to be detected based on the preset signal.

20 Claims, 6 Drawing Sheets

VOLTAGE DETECTION CIRCUIT AND METHOD FOR INTEGRATED CIRCUIT, AND INTEGRATED CIRCUIT

CROSS REFERENCE OF RELATED APPLICATION

The present application claims priority to Chinese Patent Application No. 202110497286.9, titled "VOLTAGE DETECTION CIRCUIT AND METHOD FOR INTEGRATED CIRCUIT, AND INTEGRATED CIRCUIT", filed on May 7, 2021 with the Chinese Patent Office, which is incorporated herein by reference in its entirety.

FIELD

The present disclosure relates to the technical field of an integration circuit, and in particular to a voltage detection circuit and method for an integrated circuit, and an integrated circuit.

BACKGROUND

An integrated circuit may operate stably under driving of a stable voltage signal. In the actual operation of the integrated circuit, voltage fluctuation may occur.

SUMMARY

This section is provided to introduce the concept briefly, and the concept is described in detail in specific embodiments hereinafter. This section is neither intended to identity key features or necessary features of the claimed technical solutions, nor intended to limit scope of the claimed technical solutions.

A voltage detection circuit and a voltage detection method for an integrated circuit, and an integrated circuit are provided according to embodiments of the present disclosure.

In a first aspect, a voltage detection circuit for an integrated circuit is provided according embodiments of the present disclosure. The voltage detection circuit includes a first current source, a first branch and a second branch. Both a signal input end of the first branch and a signal input end of the second branch are connected to an output terminal of the first current source. The first branch includes a first voltage control current component and a first load connected in series, and the second branch includes a current signal detection component and a second load connected in series. A voltage signal to be detected is inputted into a control signal input terminal of the first voltage control current component, and the first voltage control current component is configured to adjust a first current flowing through the first branch according to a size of the voltage signal to be detected. The current signal detection component is configured to output, in a real time manner, a preset signal characterizing a second current flowing through the second branch, to determine change of the voltage signal to be detected based on the preset signal.

In a second aspect, an integrated circuit is provided according to embodiments of the present disclosure. The integrated circuit includes a power supply unit, the voltage detection circuit according to the first aspect and a signal processing unit. The power supply unit is configured to supply power to the signal processing unit of the integrated circuit. The voltage detection circuit is configured to detect fluctuation of a voltage signal outputted to the signal processing unit from the power supply unit. The signal processing unit is configured to analyze the fluctuation detected by the voltage detection circuit and output an analysis result.

In a third aspect, a voltage detection method for an integrated circuit is provided according to embodiments of the present disclosure. The method is applied to the voltage detection circuit according to the first aspect. The method includes: inputting a voltage signal to the detected to a control terminal of the first voltage control current component of the voltage detection circuit; and determining change of the voltage signal to be detected, according to a preset signal outputted by the current signal detection component of the second branch which is read in real time, and a predetermined association between voltage signals to be detected and preset signals.

BRIEF DESCRIPTION OF THE DRAWINGS

With reference to the drawings and specific embodiments below, the above and other features, advantages and aspects of the present disclosure become more apparent. Throughout the drawings, the same or similar reference numerals indicate the same or similar elements. It should be understood that the drawings are schematic, and components and elements are unnecessarily drawn in scale.

DETAILED DESCRIPTION

Embodiments of the present disclosure are described in detail hereinafter with reference to the drawings. Although the drawings show some embodiments of the present disclosure, it should be understood that the present disclosure may be implemented by various embodiments and are not limited to be implemented by the embodiments clarified herein. The embodiments described in the present disclosure are intended to illustrate the present disclosure thoroughly and completely. It should be understood that the drawings and the embodiments are only schematic, and are not intended to limit the protection scope of the present disclosure.

It should be understood that, steps described in the embodiments of the present disclosure may be performed in different orders and/or performed in parallel. In addition, the method embodiments may include additional steps and/or steps omitted. The scope of the present disclosure is not limited thereto.

The term "including" and variations thereof adopted herein is inclusive, that is "including but not limited to". The term "based on" means "at least partially based on". The term "one embodiment" means "at least one embodiment", and the term "another embodiment" means "at least another embodiment". The term "some embodiments" means "at least some embodiments". Definitions of other terms are provided below.

It should be noted that, the terms "first" "second" and so on mentioned in the present disclosure are only used to distinguish different apparatuses, modules or units, rather than limit an order of functions performed by the apparatus, module or unit or limit interdependence.

It should be noted that, the terms "one" and "multiple" mentioned in the present disclosure are schematic rather than restrictive, and should be understood as "one or more" by those skilled in the art, otherwise explicitly illustrated in the context.

Names of messages or information interacted between multiple apparatuses in the embodiments of the present disclosure are illustrative rather than limit the scope of the message or information.

Figure 1A:
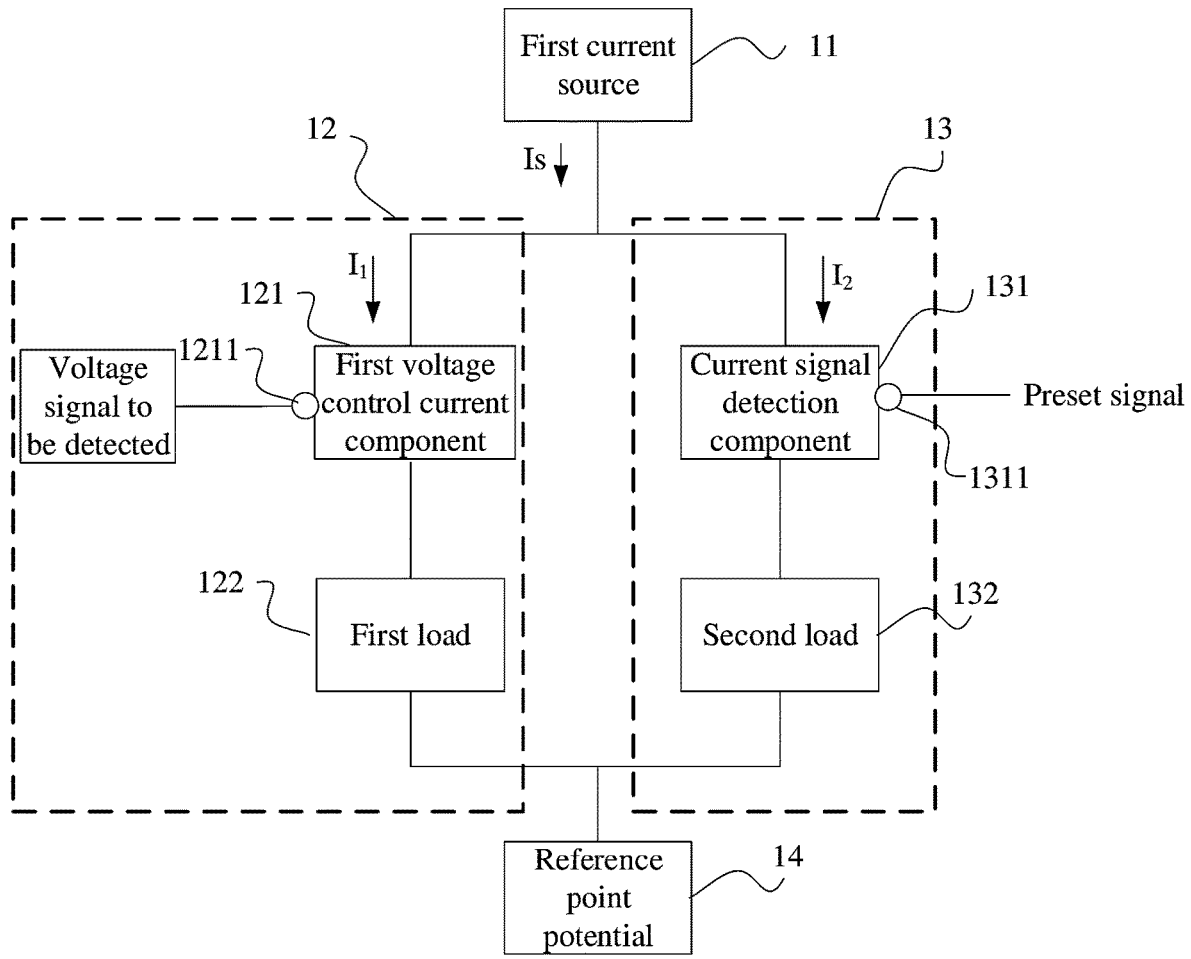
FIG. 1A and FIG. 1B are schematic structural diagrams of a voltage detection circuit for an integrated circuit according to an embodiment of the present disclosure.
Figure 1B:
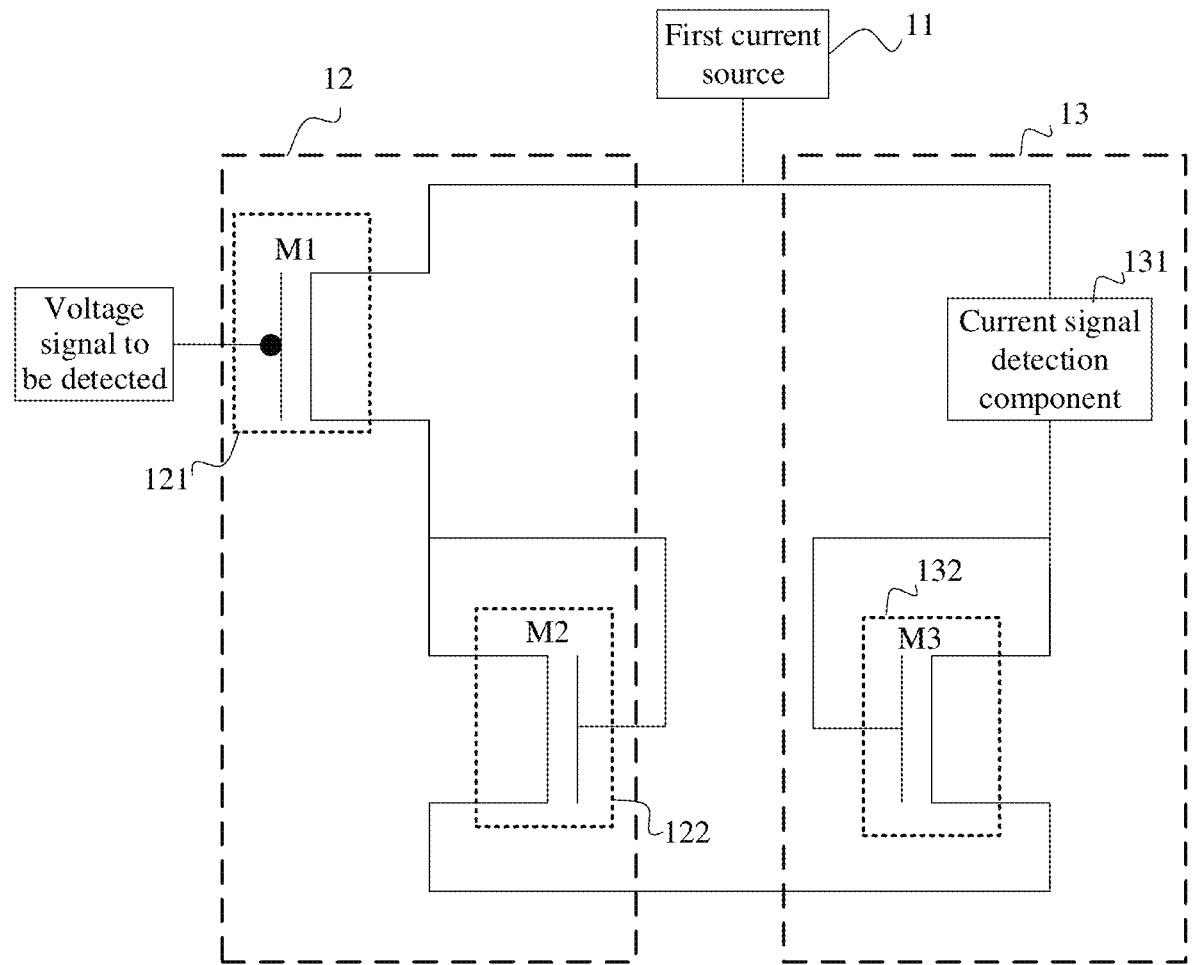

Reference is made to FIG. 1A and FIG. 1B which show a schematic structural diagram of a voltage detection circuit for an integrated circuit according to an embodiment of the present disclosure. As shown in FIG. 1A, the voltage detection circuit for the integrated circuit includes: a first current source 11, a first branch 12 and a second branch 13.

Both a signal input end of the first branch 12 and a signal input end of the second branch 13 are connected to an output terminal of the first current source 11.

The first branch 12 includes a first voltage control current component 121 and a first load 122 connected in series. A voltage signal to be detected is inputted to a control signal input terminal 1211 of the first voltage control current component 121. The first voltage control current component 121 is configured to adjust a size of a first current flowing through the first branch 12 according to a size of the voltage signal to be detected.

The second branch 13 includes a current signal detection component 131 and a second load 132 connected in series. The current signal detection component 131 is configured to detect and output, in a real time manner, a preset signal characterizing a second current flowing through the second branch 13, to determine change of the voltage signal to be detected based on the preset signal.

The preset signal herein is related to a current signal detection component adopted. In a case that the current signal detection component is a current meter, the preset signal may be a current signal.

An output end of the first branch 12 and an output end of the second branch 13 are connected to a preset reference point potential.

In some application scenes, the preset reference point may be a grounding point.

A total current outputted by the first current source 11 is allocated to the first branch 12 and the second branch 13. A size of the first current $I_1$ flowing through the first branch 12 is related to the voltage signal to be detected which is inputted to the control terminal 1211 of the first voltage control current component 121. The first voltage control current component 121 can control the size of the first current $I_1$ flowing through the first branch 12 according to the size of the voltage signal to be detected which is inputted to the control terminal 1211. For example, as the voltage signal to be detected is increased, the first voltage control current component 121 controls the first current $I_1$ flowing through the first branch 12 to decrease.

A sum of the first current $I_1$ and the second current $I_2$ is equal to the total current $I_s$ outputted by the first current source 11. Therefore, as the size of the first current $I_1$ changes, the size of the second current $I_2$ changes accordingly. For example, the first voltage control current component 121 may control the first current $I_1$ flowing through the first branch 12 to decrease as the voltage signal to be detected which is inputted to the control terminal 1211 is increased. Since the sum of the first current $I_1$ and the second current $I_2$ is equal to the total current outputted by the first current source, the second current $I_2$ flowing through the second branch 13 is increased accordingly as the first current $I_1$ is decreased. Thus, change of the voltage signal to be detected is determined according to change of the second current $I_2$.

In the embodiment, current change of the second branch 13 is detected by utilizing the current signal detection unit 131 of the second branch 13, and current change of the first branch 12 is inferred, thereby determining the change of the voltage signal to be detected. In this way, an accurate detection result of the voltage signal to be detected can be obtained.

In some embodiments, as shown in FIG. 1B, the first voltage control current component 121 may be a first MOS transistor. A gate of the first MOS transistor serves as the control terminal of the first voltage control current component 121 to receive the voltage signal to be detected. A source of the first MOS transistor serves the input terminal of the first voltage control current component 121 and is connected to the output terminal of the first current source 11. A drain of the first MOS transistor serves as the output terminal of the first voltage control current component 121 and is connected to an input end of the first load 122.

The first MOS transistor may have various types. Preferably, the first MOS transistor is a P-MOS transistor. The first MOS transistor may operate in a linear region.

When the first MOS transistor is a P-MOS transistor and the voltage signal to be detected inputted to the gate of the first MOS transistor is increased, a first current $I_1$ flowing through the source and the drain of the first MOS transistor is decreased. Therefore, the first current flowing through the first branch is adjusted according to the change of the voltage signal to be detected inputted to the control terminal by the first MOS transistor.

In some optional embodiments, the first load includes a second MOS transistor. A drain of the second MOS transistor serves as an input end of the first load and is connected to the output terminal of the first voltage control current component 121. A gate of the second MOS transistor is connected to the drain. A source of the second MOS transistor serves an output end of the load and is connected to a preset reference point potential.

The current signal detection unit 131 may include a first output terminal 1311 and a second output terminal. The first output terminal 1311 is configured to output the preset signal, and the second output terminal is configured to connect to the input end of the second load.

Optionally, the second load includes a third MOS transistor. A drain of the third MOS transistor serves as the input end of the second load and is connected to the second output terminal of the current signal detection component 131. A gate of the third MOS transistor is connected to the drain. A source of the third MOS transistor serves as the output end of the second load and is connected to a preset reference point potential.

Figure 2:
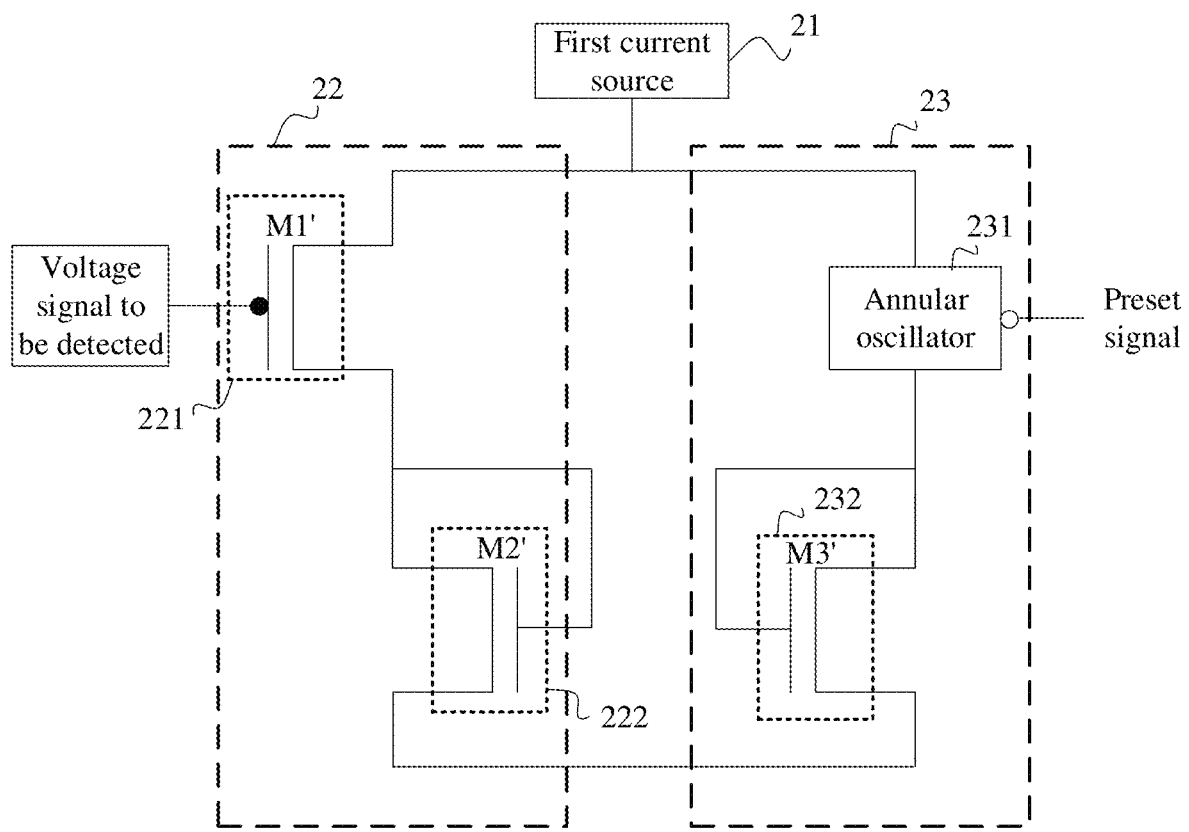
FIG. 2 is a schematic structural diagram of a voltage detection circuit for an integrated circuit according to another embodiment of the present disclosure.

Reference is made to FIG. 2 which shows a schematic structural diagram of a voltage detection circuit for an integrated circuit according to another embodiment of the present disclosure. The voltage detection circuit for the integrated circuit includes a first current source 21 and a first branch 22, similar to FIG. 1A, and details are not described herein. In addition, the voltage detection circuit includes a second branch 23. The second branch 23 includes a current signal detection unit and a second load 232.

The first branch 22 includes a first voltage control current component 221 and a first load 222 connected in series. A voltage signal to be detected is inputted to a control signal input terminal of the first voltage control current component 221. The first voltage control current component 221 is configured to adjust a size of a first current flowing through the first branch 22 according to a size of the voltage signal to be detected.

Similar to FIG. 1B, the first voltage control current component 221 may be a first MOS transistor M1'. The first MOS transistor M1' may be a P-MOS transistor. The first load may be a second MOS transistor MT. For connection of the first MOS transistor in the first branch, one may refer to the above embodiment as shown by FIG. 1B, and details are not described herein.

Different from the embodiment shown by FIG. 1A and FIG. 1B, a current signal detection component of the second branch 23 of the voltage detection circuit for the integrated circuit shown in FIG. 2 includes annular oscillator 231.

The annular oscillator 231 may include inverters connected end to end the number of which is an odd number. The annular oscillator 231 may include an input terminal, a first output terminal 2311 and a second output terminal.

The annular oscillator 231 may adjust an inputted current signal to be a signal oscillating periodically. A frequency of periodic oscillation may be determined according to the signal outputted by the annular oscillator. A frequency for outputting a signal oscillating periodically by the annular oscillator 231 is related to a size of a current inputted to the annular oscillator (that is, the second current flowing through the second branch). For example, the frequency of the signal oscillating periodically is in proportion to the size of the current flowing through the annular oscillator 231.

The first output terminal 2311 of the annular oscillator 231 outputs a current signal oscillating periodically. The second output terminal of the annular oscillator 231 serves as the output terminal of the current signal detection component and is connected to the input end of the second load.

In the embodiment, the preset signal outputted by the current signal detection component may be a current signal oscillating periodically. An oscillation frequency may be determined according to the current signal oscillating periodically.

The second load 232 may be a third MOS transistor. For connection of the third MOS transistor in the second branch, one may refer to the above embodiment shown by FIG. 1B, and details are not described herein.

In the embodiment, parameters of the first load 222 may be the same as parameters of the second load 232.

In the embodiment, the annular oscillator 231 serves as the current signal detection component, and the current signal flowing through the second branch 23 is converted into the signal oscillating periodically. The signal oscillating periodically is detected rather than detecting the current signal, thereby reducing influence on a detection result of the current signal from noise, and thus improving detection accuracy of the voltage signal to be detected.

Figure 3:
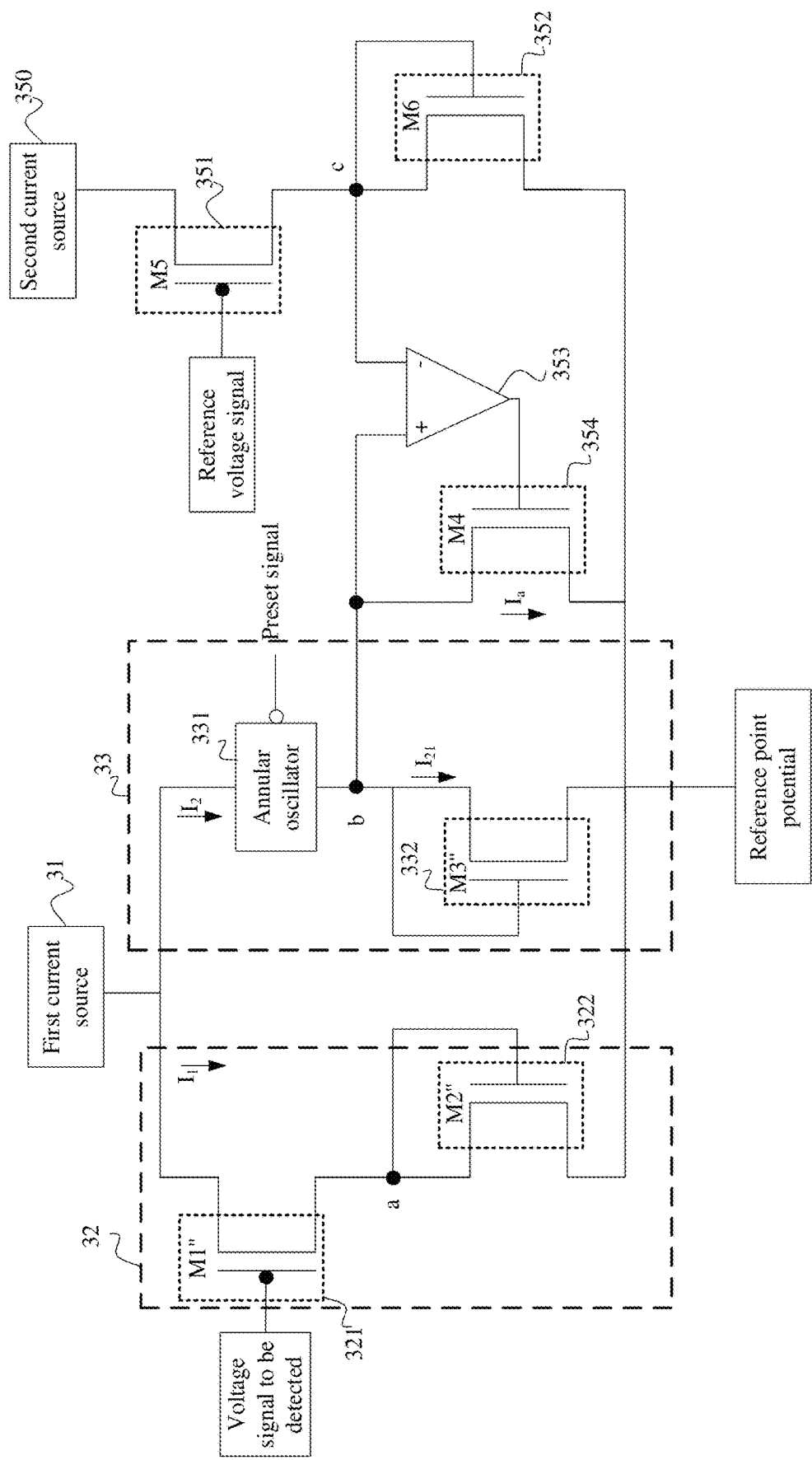
FIG. 3 is a schematic structural diagram of a voltage detection circuit for an integrated circuit according to another embodiment of the present disclosure.

Reference is made to FIG. 3 which shows a schematic structural diagram of a voltage detection circuit for an integrated circuit according to another embodiment of the present disclosure. As shown in FIG. 3, the voltage detection circuit for the integrated circuit includes a first current source 31, a first branch 32 and a second branch 33.

The first branch 32 may include a first voltage control current component 321 and a first load 322. The first voltage control current component may be a first MOS transistor Mr. The first load 322 may be a second MOS transistor M2". For connection of various components in the first branch 32, one may refer to the above embodiments shown by FIG. 1A and FIG. 1B. Details are not described herein.

The second branch 33 in the embodiment may include a second load 332 and a current signal detection component the same as those shown in FIG. 2, for example the annular oscillator 331.

Different from the embodiment shown in FIG. 2, the voltage detection circuit for the integrated circuit according to this embodiment further includes a potential adjustment subcircuit. The potential adjustment subcircuit is configured to adjust a potential at a signal input end of the first load to tend to be the same as a potential at a signal input end of the second load. The potential adjustment subcircuit may divide the current outputted by the first current source 31 into a first current and a second current which are substantially equal to each other. The first current flows through the first branch, and the second current flows through the second branch. In this way, the problem in the embodiments shown in FIG. 2 that the first current differs greatly from the second current due to asymmetric configuration of the first branch and the second branch can be solved.

In an implementation, the potential adjustment subcircuit includes a second current source 350, a second voltage control current component 351, a third load 352, an operational amplifier 353 and a fourth MOS transistor M4.

A size of a current signal outputted by the second current source 350 is half of a size of a current signal outputted by the first current source 31. A reference detection voltage signal is inputted to the control terminal of the second voltage control current component 351. The input terminal of the second voltage control current component 351 is connected to the output terminal of the second current source 350. The output terminal of the second voltage control current component 351 is connected to a first signal input terminal of the operational amplifier 353, and is connected to an input end of the third load 352. A second signal input terminal of the operational amplifier 353 is connected to the input end of the second load 332. A gate of the fourth MOS transistor M4 is connected to an output terminal of the operational amplifier 353. A drain of the fourth transistor M4 is connected to a signal input end of the second load 332, and is connected to a second signal input terminal of the operational amplifier 353. A source of the fourth MOS transistor is connected to an output end of the third load 352. The input end of the third load 352 is connected to the first signal input terminal of the operational amplifier 353, and the output end of the third load 352 is connected to a reference potential.

The reference point potential may be a grounding point potential for example.

A size of the reference detection voltage signal may be an expected value of the voltage signal to be detected. For example, if an expected value of the voltage signal to be detected is 12V, the reference detection voltage signal may be a reference detection voltage signal of 12V.

Parameters of the third load 352 are same as parameters of the first load 322 and parameters of the second load 332. In the embodiment, the first load 322, the second load 332 and the third load 352 may be MOS transistors with same parameters, such as N-MOS transistor.

The first load 322 is a second MOS transistor M2", and the second load 322 may be a third MOS transistor M3". For connection of the first load 322 and the second load 332, one may refer to the above embodiment shown by FIG. 1B, and details are not described herein.

The third load 352 may be a sixth MOS transistor M6. A drain and a gate of the sixth MOS transistor M6 are connected to each other. The drain of the sixth MOS transistor M6 serves as an input end of the third load 352 and is connected to the output terminal of the second voltage control current component 351, and is connected to the first signal input terminal of the operational amplifier 353. A source of the sixth MOS transistor M6 serves the output end of the third load 352, and is connected to a preset reference potential. The fourth MOS transistor M4 may have same parameters as those of the third MOS transistor M3".

The second voltage control current component 351 may be a MOS transistor (a fifth MOS transistor M5). A gate of the fifth MOS transistor serves as the control terminal of the second voltage control current component 351 to receive a reference detection voltage signal. The fifth MOS transistor M5 may be a P-MOS transistor.

A size of the current signal outputted by the second current source 350 may be Ib/2, where Ib represents a size of the current signal outputted by the first current source 31.

In the embodiment, the operational amplifier and the fourth MOS transistor M4 form a feedback circuit, configured to adjust a potential at a point b located at the input terminal of the second load 332 tend to be the same as a potential at a point c located at the input end of the third load 352.

Assuming that change of the voltage signal to be detected is indicated by $\Delta V_{in}$. Change of the current $I_1$ flowing through the first branch 32 is indicated by $\Delta I_1 = -\Delta V_{in} \times g_m$, where $g_m$ indicates a transconductance of the first MOS transistor M1".

Assuming that the first MOS transistor M1" is a p-MOS transistor. If $\Delta V_{in}$ is positive, that is, the voltage signal to be detected is added by $\Delta V_{in}$ relative to the expected value Vin, the first current flowing through the first branch 32 is decreased by $\Delta I_1$ accordingly.

Accordingly, the second current $I_2$ flowing through the second branch 33 is increased by $\Delta I_2$ that is, $\Delta I_2 = -\Delta I_1$. Accordingly, a frequency of the annular oscillator changes according to $\Delta I_2$. Generally, the oscillation frequency of the oscillation signal of the annular oscillator changes linearly according to $\Delta I_2$. Specifically, the change $\Delta f$ of the oscillation frequency may be indicated as $\Delta f = k \times \Delta I_2$, where k is an constant. The oscillation frequency may be expressed by $f = c \times f_0 + d \times \Delta f$, where c and d herein may be constants, and $f_0$ indicates an oscillation frequency of a periodic oscillation signal outputted by the annular oscillator when the voltage to be detected is equal to the expected value.

An association between the voltage signal to be detected and the oscillation frequency of the annular oscillator 331 may be established in advance. In the circuit shown in FIG. 3, the size of the voltage signal to be detected is determined according to the preset signal (the oscillation frequency of the periodic oscillation signal) outputted by the annular oscillator 331.

An operation process of the potential adjustment subcircuit is described hereinafter.

The first signal input terminal of the operational amplifier 353 may be an inverting input terminal of the operational amplifier 353. The second signal input terminal of the operational amplifier 353 may be a non-inverting input terminal.

As shown in FIG. 3, if a potential at the point b is higher than a potential at the point c, that is, Vb is grater than Vc, a voltage signal Vb is inputted to the non-inverting input terminal of the operational amplifier 353, and a voltage signal Vc is inputted to the inverting input terminal of the operational amplifier. Since Vb is greater than Vc, an output signal of the operational amplifier is increased. In this case, a gate voltage of the fourth transistor M4 is increased, so that a current $I_a$ flowing through the fourth transistor M4 is increased. A sum of the current $I_a$ flowing through the fourth transistor M4 and a current flowing through the second load 332 is equal to a current flowing through the second branch 33. Since the current $I_a$ flowing through the fourth transistor M4 is increased, a current $I_{21}$ flowing through the second load is decreased. Decreasing of $I_{21}$ pulls down the potential of the point b, so that the potential Vb at the point b intends to be same as the potential Vc at the point c. The structure of the first branch 32 is the same as a structure of a subcircuit formed by the second voltage control current component and the third load, and the size of a reference detection voltage signal inputted to the control terminal of the second voltage control current component is an expected value of the voltage signal to be detected. The size of the current signal outputted by the second current source is half of the current signal outputted by the first current source. Therefore, the potential Va at the point a is approximately equal to the potential Vc at the point c.

Since Vc is approximately equal to Va, Vc, Va and Vb are approximately the same to each other. In this case, the current outputted by the current source is allocated approximately equally for the first branch 32 and the second branch 33, and M1 can operate at an expected operation point.

Compared with the embodiment shown by FIG. 2, in this embodiment, the potential adjustment subcircuit is arranged in the second branch. The potential of the second load is adjusted by the potential adjustment subcircuit, so that the current flowing through the first branch is approximately equal to the current flowing through the second branch. Therefore, the voltage signal to be detected can be detected while ensuring that the first current flowing through the first branch is approximately equal to the second current flowing through the second branch, thereby solving the problem that the detection result of the voltage signal to be detected is not accurate due to a great difference between the first current flowing through the first branch and the second current flowing through the second branch.

Figure 4:
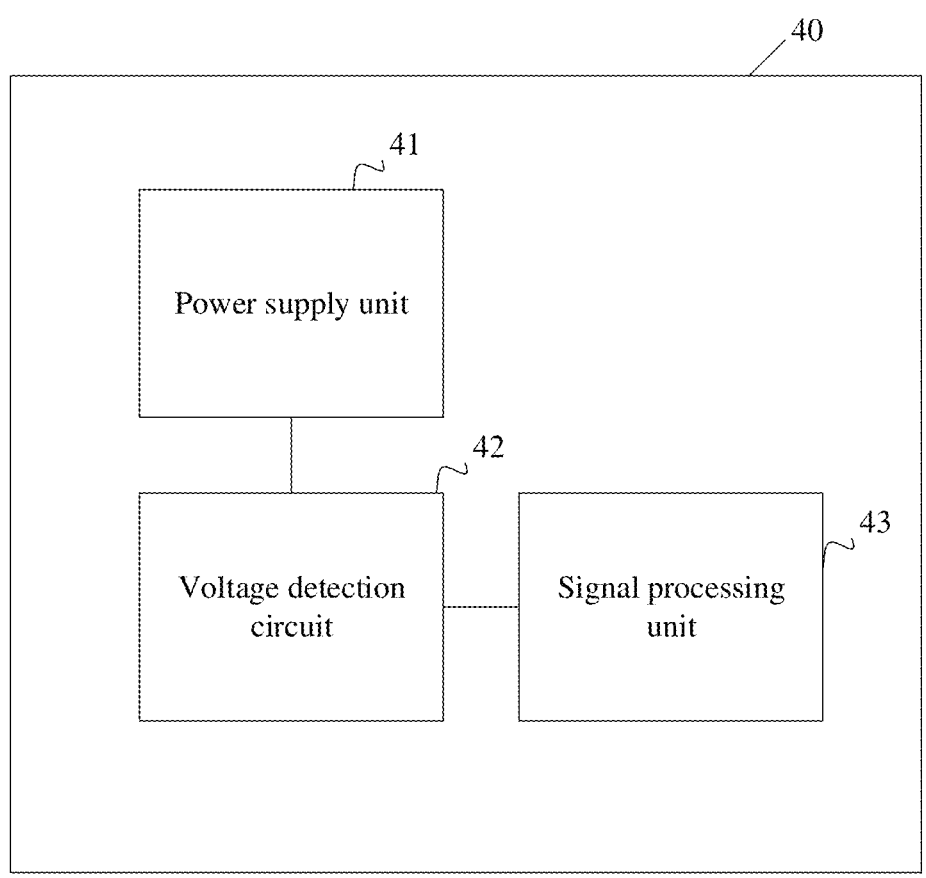
FIG. 4 is a schematic structural diagram of an integrated circuit according to an embodiment of the present disclosure.

Reference is made to FIG. 4 which shows a schematic structural diagram of an integrated circuit according to an embodiment of the present disclosure.

As shown in FIG. 4, an integration circuit 40 includes a power supply unit 41, a voltage detection circuit 42 according to any of the embodiments shown by FIG. 1A, FIG. 1B, FIG. 2, FIG. 3, and a signal processing unit 43.

The power supply unit 41 is configured to supply power to the signal processing unit in the integrated circuit.

The voltage detection circuit 42 is configured to detect a size of a voltage signal outputted to the signal processing unit 43 from the power supply unit 41.

The signal processing unit 43 is configured to analyze fluctuation of a voltage signal outputted by the voltage detection circuit 42 and output an analysis result.

Figure 5:
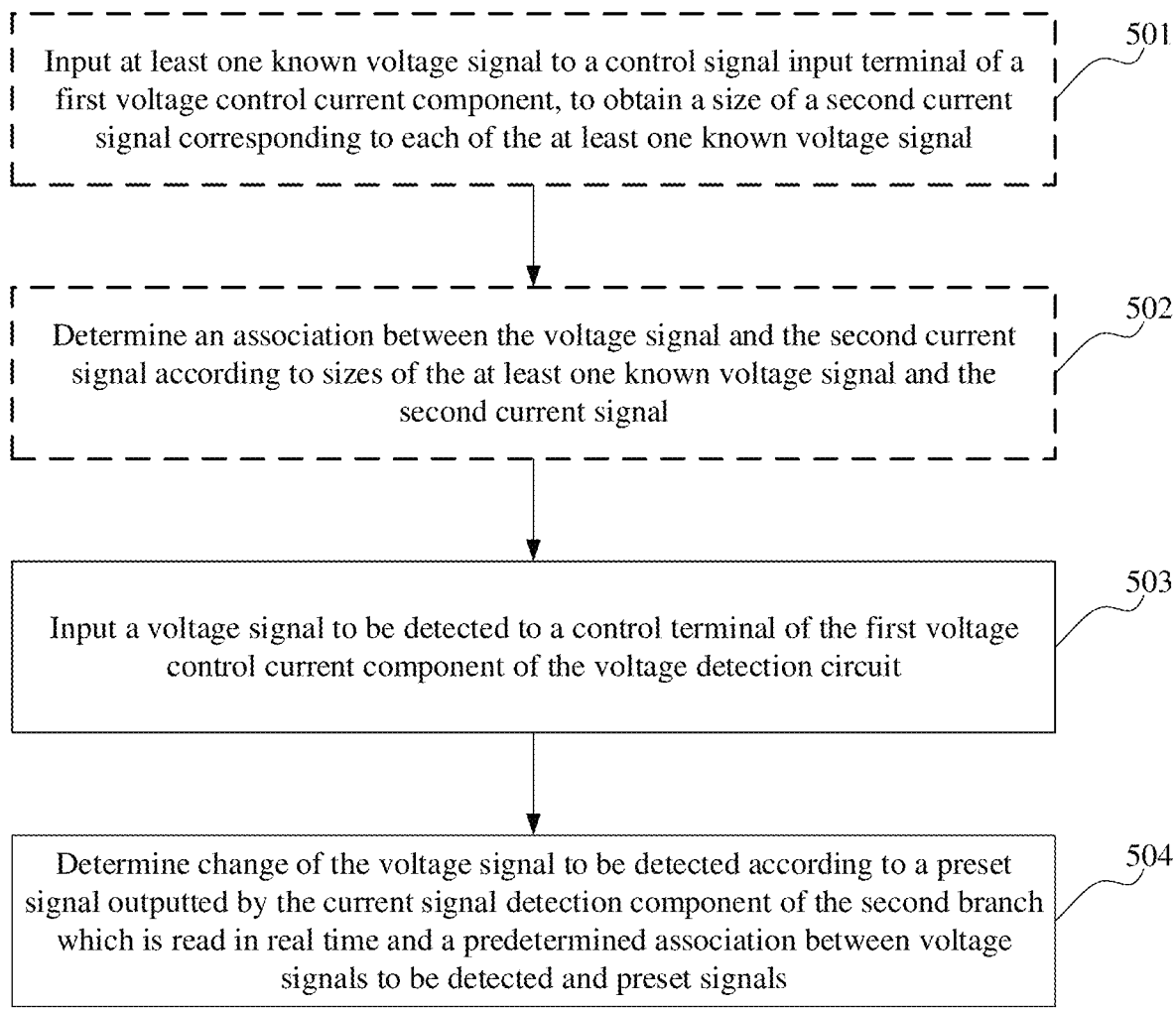
FIG. 5 is a schematic flowchart of a voltage detection method for an integrated circuit according to an embodiment of the present disclosure.

Reference is made to FIG. 5 which shows a schematic flowchart of a voltage detection method for an integrated circuit according to an embodiment of the present disclosure.

A voltage detection circuit for an integrated circuit includes: a first current source, a first branch and a second branch. Both a signal input end of the first branch and a signal input end of the second branch are connected to an output terminal of the first current source. The first branch includes a first voltage control current component and a first load connected in series. The second branch includes a current signal detection component and a second load connected in series. A voltage signal to be detected is inputted to a control signal input terminal of the first voltage control current component. The first voltage control current component is configured to adjust a first current flowing through the first branch according to a size of the voltage signal to be detected. The current signal detection component is configured to output, in a real time manner, a preset signal characterizing a second current flowing through the second branch, to determine change of the voltage signal to be detected based on the preset signal. The voltage detection circuit for the integrated circuit may be the voltage detection circuit for the integrated circuit according to any of the embodiments shown by FIG. 1A, FIG. 1B, FIG. 2, FIG. 3.

As shown in FIG. 5, the voltage detection method for the integrated circuit includes the following steps S503 to S504.

In step 503, a voltage signal to be detected is inputted to a control terminal of a first voltage control current component of the voltage detection circuit for the integrated circuit.

In some application scenes, an output end of a power supply unit outputting the voltage signal to be detected may be connected to the control terminal of the first voltage control current component via a switch device. When a voltage signal is to be detected, the switch device is switched on in response to a control signal, and thus the voltage signal to be detected is inputted to the control terminal of the first voltage control current component.

In other application scenes, the output end of the power supply unit outputting the voltage signal to be detected may be directly connected to the control terminal of the first voltage control current component, so that the voltage detection circuit detects the voltage signal to be detected in a real time manner.

In step 504, change of the voltage signal to be detected is determined, according to a preset signal outputted by a current signal detection component of the second branch which is read in real time, and a predetermined association between voltage signals to be detected and preset parameters of preset signals.

The preset signals are different for different current signal detection components. In a case that the current signal detection component is a current meter, the preset signal may be a second current signal flowing through the second branch.

An association between voltage signals to be detected and sizes of the second current signal may be established in advance. The preset parameter of the preset signal may be a size of the current.

In an actual detection, the size of the voltage signal to be detected is determined according to the second current signal outputted by the current signal detection component.

In some application scenes, the current signal detection component may be annular oscillator. In a case that the current signal detection component is an annular oscillator, the preset signal may be a current signal oscillating periodically.

An oscillation frequency may be determined according to the current signal oscillating periodically. The preset parameter of the preset signal may be an oscillation frequency of the current signal oscillating periodically.

An association between voltage signals to be detected and frequencies of oscillation signals outputted by the annular oscillator may be established in advance.

In an actual detection, a size of the voltage signal to be detected is determined according to the frequency of the oscillation signal outputted by the annular oscillator and the association.

For related content, one may refer to the illustration of the embodiments shown by FIG. 2 and FIG. 3. Details are not described herein.

In some optional embodiments of the present disclosure, before step 503, the voltage detection method for an integrated circuit includes the following steps 501 and 502.

In step 501, at least one known voltage signal is inputted to a control signal input terminal of the first voltage control current component, and a preset signal corresponding to each of the at least one known voltage signal is obtained from the current signal detection component.

In step 502, an association between the voltage signal and a preset parameter of the preset signal is determined according to sizes of the at least one known voltage signal and the preset signal.

The preset signal may be a second current flowing through the second branch.

The preset parameter may be a size of the second current flowing through the second branch.

In some application scenes, the preset signal may be a periodic oscillation signal outputted by the annular oscillator in the second branch. The preset parameter may be an oscillation frequency of the annular oscillator in the second branch.

In some optional embodiments, the voltage detection circuit for the integrated circuit can be calibrated in specific application scenes by performing steps 501 and 502. The calibration is performed, so that the association between voltage signals to be detected and preset parameters of the preset signals is re-established, and thus the voltage signal to be detected is detected according to the association re-established by performing steps 503 and 504, thereby solving the problem that a detection result of the voltage detection circuit for the integrated circuit is not accurate due to influence of temperature.

In some optional embodiments, at least two voltage detection circuits may be provided in the integrated circuit. The voltage detection circuit to which a voltage signal to be detected is inputted is switched when a preset time period expires. The voltage signal to be detected is detected continuously by using the switched voltage detection circuit. The voltage detection circuit disconnected from the voltage signal to be detected is calibrated by performing steps 501 and 502, for example.

The preferred embodiments and the technical principles of the present disclosure are described above. It should be understood by those skilled in the art that, the protection scope of the present disclosure is not limited to the technical solutions formed by specific combination of the above technical features, and other technical solutions formed by random combinations of the above technical features or equivalent features without departing from the concept of the present disclosure also fall within the protection scope of the present disclosure, for example the technical solution formed by replacement between the above technical features and technical features with similar functions disclosed (not limited) in the present disclosure.

Although the operations are described in a specific order, the operations are unnecessarily to be performed in the specific order or in a chronological order. In a certain environment, a multi-task and parallel processing may be beneficial. Although specific details are described above, the details should not be understood as restriction to the scope of the present disclosure. Some features described in the context of different embodiments may be combined in one embodiment. Alternatively, the features described in the context of one embodiment may be implemented in multiple embodiments independently or in any appropriate sub-combination.

The subject matter is described by language specific to the structure feature and/or method logic, it should be understood that the subject matter defined in the appended claims is not limited to the specific features or actions described above. The specific features and actions are only schematic implementation of the claims.

The invention claimed is:

1. A voltage detection circuit for an integrated circuit, comprising: a first current source, a first branch, and a second branch, wherein
both a signal input end of the first branch and a signal input end of the second branch are connected to an output terminal of the first current source;
the first branch comprises a first voltage control current component and a first load connected in series, and the second branch comprises a current signal detection component and a second load connected in series;
a voltage signal to be detected is inputted into a control signal input terminal of the first voltage control current component, and the first voltage control current component is configured to adjust a first current flowing through the first branch according to a size of the voltage signal to be detected; and
the current signal detection component is configured to output, in a real time manner, a preset signal characterizing a second current flowing through the second branch, to determine change of the voltage signal to be detected based on the preset signal.

2. The voltage detection circuit according to claim 1, wherein the first voltage control current component is a first MOS transistor, wherein
the voltage signal to be detected is inputted into a gate of the first MOS transistor;
a source of the first MOS transistor is connected to the output terminal of the first current source; and
a drain of the first MOS transistor is connected to the first load.

3. The voltage detection circuit according to claim 2, wherein the first MOS transistor is a P-MOS transistor.

4. The voltage detection circuit according to claim 1, wherein the current signal detection component comprises an annular oscillator, the preset signal indicates an oscillation frequency outputted by the annular oscillator, and the oscillation frequency is related to the second current flowing through the second branch.

5. The voltage detection circuit according to claim 1, wherein the first load comprises a second MOS transistor, a drain of the second MOS transistor is connected to an output terminal of the first voltage control current component, a gate of the second MOS transistor is connected to the drain, and a source of the second MOS transistor is connected to a reference potential.

6. The voltage detection circuit according to claim 5, wherein the second load comprises a third MOS transistor, a drain of the third MOS transistor is connected to a second output terminal of the current signal detection component, a gate of the third MOS transistor is connected to the drain, a source of the third MOS transistor is connected to a reference potential, and the preset signal is outputted from a first output terminal of the current signal detection component.

7. The voltage detection circuit according to claim 4, further comprising a potential adjustment subcircuit, configured to adjust a potential at a signal input end of the first load to tend to be the same as a potential at a signal input end of the second load.

8. The voltage detection circuit according to claim 7, wherein the potential adjustment subcircuit comprises a second current source, a second voltage control current component, a third load, an operational amplifier and a fourth MOS transistor, wherein
a size of a current signal outputted by the second current source is half of a size of a current signal outputted by the first current source;
a reference detection voltage signal is inputted to a control terminal of the second voltage control current component, a signal input terminal of the second voltage control current component is connected to an output terminal of the second current source, a signal output terminal of the second voltage control current component is connected to a first signal input terminal of the operational amplifier, and a second signal input terminal of the operational amplifier is connected to the signal input end of the second load; and
a gate of the fourth MOS transistor is connected to a signal output terminal of the operational amplifier, a drain of the fourth MOS transistor is connected to the signal input end of the second load and is connected to a second signal input terminal of the operational amplifier; a source of the fourth MOS transistor is connected to an output end of the third load, an input end of the third load is connected to the first signal input terminal of the operational amplifier, and the output end of the third load is connected to a reference potential.

9. The voltage detection circuit according to claim 8, wherein the second voltage control current component comprises a fifth MOS transistor, a gate of the fifth MOS transistor serves as the control terminal of the second voltage control current component; and
a source of the fifth MOS transistor serves as the signal input terminal of the second voltage control current component, and a drain of the fifth MOS transistor serves as the signal output terminal of the second voltage control current component.

10. The voltage detection circuit according to claim 8, wherein the third load comprises a sixth MOS transistor, a drain of the sixth MOS transistor is connected to the output terminal of the second voltage control current component, and a gate of the sixth MOS transistor is connected to the drain; and
a source of the sixth MOS transistor is connected to a reference voltage.

11. An integrated circuit, comprising: a power supply unit, a voltage detection circuit, and a signal processing unit, wherein the power supply unit is configured to supply power to the signal processing unit of the integrated circuit; the voltage detection circuit is configured to detect fluctuation of a voltage signal outputted to the signal processing unit from the power supply unit, the voltage detection circuit comprises comprise a first current source, a first branch, and a second branch, wherein both a signal input end of the first branch and a signal input end of the second branch are connected to an output terminal of the first current source; the first branch comprises a first voltage control current component and a first load connected in series, and the second branch comprises a current signal detection component and a second load connected in series; a voltage signal to be detected is inputted into a control signal input terminal of the first voltage control current component, and the first voltage control current component is configured to adjust a first current flowing through the first branch according to a size of the voltage signal to be detected; and the current signal detection component is configured to output, in a real time manner, a preset signal characterizing a second current flowing through the second branch, to determine change of the voltage signal to be detected based on the preset signal; the signal processing unit is configured to analyze the fluctuation detected by the voltage detection circuit and output an analysis result.

12. The integrated circuit according to claim 11, wherein the first voltage control current component is a first MOS transistor, wherein
the voltage signal to be detected is inputted into a gate of the first MOS transistor;
a source of the first MOS transistor is connected to the output terminal of the first current source; and
a drain of the first MOS transistor is connected to the first load.

13. The integrated circuit according to claim 11, wherein the current signal detection component comprises an annular oscillator, the preset signal indicates an oscillation frequency outputted by the annular oscillator, and the oscillation frequency is related to the second current flowing through the second branch.

14. The integrated circuit according to claim 11, wherein the first load comprises a second MOS transistor, a drain of the second MOS transistor is connected to an output terminal of the first voltage control current component, a gate of the second MOS transistor is connected to the drain, and a source of the second MOS transistor is connected to a reference potential.

15. The integrated circuit according to claim 14, wherein the second load comprises a third MOS transistor, a drain of the third MOS transistor is connected to a second output terminal of the current signal detection component, a gate of the third MOS transistor is connected to the drain, a source of the third MOS transistor is connected to a reference potential, and the preset signal is outputted from a first output terminal of the current signal detection component.

16. The integrated circuit according to claim 13, further comprising a potential adjustment subcircuit, configured to adjust a potential at a signal input end of the first load to tend to be the same as a potential at a signal input end of the second load.

17. The integrated circuit according to claim 16, wherein the potential adjustment subcircuit comprises a second current source, a second voltage control current component, a third load, an operational amplifier and a fourth MOS transistor, wherein
a size of a current signal outputted by the second current source is half of a size of a current signal outputted by the first current source;
a reference detection voltage signal is inputted to a control terminal of the second voltage control current component, a signal input terminal of the second voltage control current component is connected to an output terminal of the second current source, a signal output terminal of the second voltage control current component is connected to a first signal input terminal of the operational amplifier, and a second signal input terminal of the operational amplifier is connected to the signal input end of the second load; and a gate of the fourth MOS transistor is connected to a signal output terminal of the operational amplifier, a drain of the fourth MOS transistor is connected to the signal input end of the second load and is connected to a second signal input terminal of the operational amplifier; a source of the fourth MOS transistor is connected to an output end of the third load, an input end of the third load is connected to the first signal input terminal of the operational amplifier, and the output end of the third load is connected to a reference potential.

18. The integrated circuit according to claim 17, wherein the second voltage control current component comprises a fifth MOS transistor, a gate of the fifth MOS transistor serves as the control terminal of the second voltage control current component; and
a source of the fifth MOS transistor serves as the signal input terminal of the second voltage control current component, and a drain of the fifth MOS transistor serves as the signal output terminal of the second voltage control current component.

19. A voltage detection method for an integrated circuit, applied to the voltage detection circuit for an integrated circuit, wherein the voltage detection circuit comprises a first current source, a first branch and a second branch; wherein both a signal input end of the first branch and a signal input end of the second branch are connected to an output terminal of the first current source; the first branch comprises a first voltage control current component and a first load connected in series, and the second branch comprises a current signal detection component and a second load connected in series; a voltage signal to be detected is inputted into a control signal input end of the first voltage control current component, and the first voltage control current component is configured to adjust a first current flowing through the first branch according to a size of the voltage signal to be detected; the current signal detection component is configured to output, in a real time manner, a preset signal characterizing a second current flowing through the second branch, to determine change of the voltage signal to be detected based on the preset signal; wherein the method comprises:
inputting a voltage signal to be detected to the control terminal of the first voltage control current component of the voltage detection circuit; and
determining change of the voltage signal to be detected, according to a preset signal outputted by the current signal detection component of the second branch which is read in real time, and a predetermined association between voltage signals to be detected and preset signals.

20. The method according to claim 19, wherein before inputting a voltage signal to be detected to the control signal input terminal of the first voltage control current component, the method further comprises:
inputting at least one known voltage signal to the control signal input terminal of the first voltage control current component, to obtain a size of a second current signal corresponding to each of the at least one known voltage signal; and
determining an association between the voltage signal and the second current signal according to a size of the at least one known voltage signal and the size of the second current signal.

* * * * *